(12) United States Patent
Yonekubo et al.

(10) Patent No.: US 7,390,129 B2
(45) Date of Patent: Jun. 24, 2008

(54) LIGHT SOURCE, METHOD FOR MANUFACTURING LIGHT SOURCE, AND PROJECTOR

(75) Inventors: Masatoshi Yonekubo, Hara-mura (JP); Hideya Seki, Okaya (JP); Takashi Takeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 175 days.

(21) Appl. No.: 11/052,220

(22) Filed: Feb. 8, 2005

(65) Prior Publication Data

US 2005/0173719 A1    Aug. 11, 2005

(30) Foreign Application Priority Data

Feb. 10, 2004    (JP) ............................. 2004-033484

(51) Int. Cl.
G02B 6/36 (2006.01)
H01L 21/00 (2006.01)
(52) U.S. Cl. ............................. 385/93; 385/90; 385/92; 257/88; 257/98; 257/E33.071; 257/E33.075
(58) Field of Classification Search .................... 257/59, 257/88, 98; 385/92, 93
See application file for complete search history.

(56) References Cited

U.S. PATENT DOCUMENTS 5,684,903 A * 11/1997 Kyomasu et al. ............. 385/93
7,165,898 B2 * 1/2007 Kato et al. .................... 385/92

2003/0123245 A1 * 7/2003 Parker et al. ................ 362/31

FOREIGN PATENT DOCUMENTS

| JP | A56-089707 | 7/1981 |
| JP | A-56-091481 | 7/1981 |
| JP | A-09-050704 | 2/1997 |
| JP | A-2000-231344 | 8/2000 |
| JP | A-2000-258640 | 9/2000 |

OTHER PUBLICATIONS

Harbers et al., "High Power LED Illuminators for Data and Video Projectors," *IDW '02 Proceedings of the Ninth International Display Workshops*, pp. 501-504 {Dec. 4-6, 2002}.

* cited by examiner

*Primary Examiner*—Dao H Nguyen
(74) *Attorney, Agent, or Firm*—Oliff & Berridge, PLC (57) ABSTRACT

A light source that has a small size can provide uniform light at high efficiency and can have a high degree of freedom in design, a method for manufacturing this light source, and a projector having this light source include a solid-state light-emitting chip that supplies G-light, which is light of a predetermined wavelength range, a support, a package mold, and a heat sink that constitute a solid-state light-emitting chip supporting part for supporting the solid-state light-emitting chip, an optical guide that reflects the G-light and thus causes the G-light to exit into an illuminating direction, and a support, which is an optical guide supporting part for supporting the optical guide. A light exiting surface of the solid-state light-emitting chip and a light incident surface of the optical guide are provided at a predetermined spacing. The solid-state light-emitting chip is, for example, an InGaN-based LED flip chip.

18 Claims, 6 Drawing Sheets

LIGHT SOURCE, METHOD FOR MANUFACTURING LIGHT SOURCE, AND PROJECTOR

BACKGROUND

Exemplary embodiments relate to a light source having a solid-state light-emitting chip, a method for manufacturing this light source, and a projector having this light source.

In the related art, progress has been made in research and development of light sources, particularly a light source having a solid-state light-emitting device. An example of the solid-state light-emitting device is a light-emitting diode (hereinafter referred to as LED). A structure for higher output from an LED has been proposed (see, for example, Gerard Harbers, Matthijs Keuper, and Steve Paolini, "High power LED illuminators for data and video projectors," (Japan), IDW '02 Proceedings of the Ninth International Display Workshops, Dec. 4-6, 2002). In the LED, in order to efficiently utilize emitted light, light from a solid-state light-emitting chip is refracted by a substantially hemispherical lens and then exits. Also, the space between the solid-state light-emitting chip and the lens is filled with a transparent gel. By using a transparent gel with its index matched with the lens, it is possible to further improve the efficiency of light derivation. Moreover, the light from the LED is converted to substantially collimated light by using a collimating lens or the like. With such a structure, for example, a light source for illuminating a spatial light modulator such as a liquid crystal panel can be provided. It is desirable that the light source for illuminating a spatial light modulator has a small size and supplies light with uniform intensity distribution at high efficiency.

SUMMARY

However, to provide uniform light from the related art light source at a high efficiency, an optical integration system is separately needed in addition to the light source. Therefore, because the device includes the optical integration system, its size increases, which is a problem. In a projector having the spatial light modulator, a spatial extent, where a luminous flux that can be effectively handled exists, can be expressed as the product of area and solid angle ("etendue" or geometrical extent) in an optical system including the light source and spatial light modulator. This product of area and solid angle is stored in the optical system. Therefore, as the spatial extent of the light source increases, the spatial extent where a luminous flux incident on the spatial light modulator exists increases. On the other hand, since the angle at which light can be taken in by the spatial light modulator is limited, it is difficult to effectively use the luminous flux from the light source. Therefore, the light source used for the projector is required to have a small size and higher efficiency in consideration of the "etendue". Accordingly, in some cases, it is desirable to improve the structure of the LED chip itself. In the case of the related art solid-state light-emitting devices such as LEDs, the LEDs themselves are distributed as complete products. Therefore, it is difficult to improve or modify the structure by providing an optical device near the LED chip or otherwise, because it may lower its reliability. As a result, the degree of freedom in designing a suitable light source for a projector or the like by using an LED is lowered, which is a problem.

In view of the foregoing status of the related art, the exemplary embodiments provide a light source that has a small size, enables provision of uniform light at high efficiency and has a high degree of freedom in design, a method for manufacturing this light source, and a projector having this light source.

To address or solve the above, according to a first exemplary embodiment, there can be provided a light source having a solid-state light-emitting chip that supplies light of a predetermined wavelength range, the solid-state light-emitting chip defining a light-emitting surface, a solid-state light-emitting chip supporting part that supports the solid-state light-emitting chip, an optical guide that reflects the light from the solid-state light-emitting chip to cause the light to exit in an illuminating direction, the optical guide defining a light-incident surface, the light exiting surface of the solid-state light-emitting chip and the light incident surface of the optical guide being provided at a predetermined spacing, and an optical guide supporting part that supports the optical guide.

Thus, the light from the solid-state light-emitting chip travels straight through the optical guide or is repeatedly reflected and exits into the illuminating direction. The light is superimposed by the repeated reflection, and light having high efficiency and uniform intensity distribution can be provided. Also, since a larger optical integration system is not necessary, a small-sized light source can be realized. Moreover, the optical guide generates an effect of relaying an image of the solid-state light-emitting chip. Therefore, a desired optical device, for example, a lens element or prism element, can be easily provided at a position to which the solid-state light-emitting chip image is relayed. Thus, a light source allowing a high degree of freedom in design can be provided without a need to change the structure of the solid-state light-emitting chip itself. Moreover, the light exiting surface of the solid-state light-emitting chip and the light incident surface of the optical guide are provided at a predetermined spacing. Therefore, propagation of heat generated in the solid-state light-emitting chip to the optical guide can be reduced.

According to an exemplary embodiment, an optically transparent soft material filling a space of the predetermined spacing is further provided, and the optically transparent soft material has substantially the same refractive index as the refractive index of a member constituting the optical guide. In the case where the spacing between the solid-state light-emitting chip and the optical guide is formed by, for example, a space of air, the light from the solid-state light-emitting chip is totally or substantially reflected by the interface to the air and the light utilization efficiency is reduced, lowered and/or minimized. In this exemplary embodiment, the space of the predetermined spacing is filled with an optically transparent soft material, for example, transparent silicon gel. The optically transparent soft material has substantially the same refractive index as the refractive index of the member constituting the optical guide, and so-called index matching is performed. Thus, since the light from the solid-state light-emitting chip is not totally reflected by an interface such as the light exiting surface of the solid-state light-emitting chip or the light incident surface of the optical guide, the light can be used at high efficiency.

According to an exemplary embodiment, the optical guide has a reflection film that reflects the light of the predetermined wavelength range at least at a part in contact with the optical guide supporting part. The light supplied from the solid-state light-emitting chip becomes incident on the optical guide at various angles. The optical guide has the reflection film at least at the part in contact with the optical guide supporting part. Therefore, the light incident on the optical guide is internally reflected by the reflection film. Moreover, the optical guide totally reflects the light on its interface to external air and thus causes the light to travel. Therefore, the light reflected by the reflection film repeats being totally or substantially reflected and then exits from the optical guide. As a result, the light from the solid-state light-emitting chip can be used at high efficiency. Moreover, the repeated reflection enables uniform intensity distribution of the exiting light.

According to an exemplary embodiment, the optical guide has the reflection film formed in an entire region of a surface along a traveling direction of the light. Light that becomes incident on the interface of the optical guide to air at an angle that does not satisfy a total or substantially total reflection condition may exit directly into a direction substantially orthogonal to the end surface of the optical guide, that is, into a lateral direction. The light thus exiting from the lateral side is not propagated through the optical guide and results in light quantity loss. In this exemplary embodiment, the reflection film is formed in the entire region of the surface of the optical guide along the traveling direction of the light. Therefore, substantially all the light can exit into the illuminating direction.

According to an exemplary embodiment, the optical guide supporting part has a reflection surface formed in a region in contact with the optical guide. Thus, the light incident on the optical guide is reflected by the reflection film of the optical guide supporting part. Moreover, the optical guide repeatedly totally or substantially reflects the light reflected by the reflection film, on its interface to external air. The light that repeats being totally or substantially reflected and travels through the optical guide exits from the light exiting surface. As a result, the light from the solid-state light-emitting chip can be used at high efficiency.

According to an exemplary embodiment, the solid-state light-emitting chip supporting part further has a heat sink for reducing heat generated in the solid-state light-emitting chip and an electrode for driving the solid-state light-emitting chip. Thus, with a simple structure, the solid-state light-emitting chip can be driven while the heat generated in the solid-state light-emitting chip is radiated.

According to an exemplary embodiment, the optical guide has at least one of a tapered shape with a light exiting surface being larger than a light incident surface, and a cylindrical shape having substantially equal light incident surface and light exiting surface, and that the light incident surface of the optical guide is substantially equal to or larger than the light exiting surface of the solid-state light-emitting chip. In the case where the optical guide has a tapered shape, uniform intensity distribution and parallelization of the exiting light can be realized at the same time. In the case where the optical guide has a straight cylindrical shape, the intensity distribution of the exiting light can be uniformed with a reduced light-emitting area.

According to an exemplary embodiment, the solid-state light-emitting chip has a lateral surface in a direction substantially orthogonal to a normal direction in a light-emitting region, and the solid-state light-emitting chip supporting part has a reflection part formed on a surface facing the lateral surface. The solid-state light-emitting chip, for example, LED, radiates light into every direction from an active layer arranged between two semiconductor layers. Therefore, light radiated into a direction different from the direction of the light incident surface of the optical guide is not effectively utilized. Particularly, light exiting into the lateral direction of the LED results in light quantity loss. In this exemplary embodiment, the reflection part is constructed to reflect light traveling in the lateral direction into the direction of the optical guide. This enables improvement in light utilization efficiency.

According to an exemplary embodiment the light incident surface of the optical guide is substantially equal to or larger than a region including the light exiting surface of the solid-state light-emitting chip and the reflection part. This enables the light from the solid-state light-emitting chip to efficiently become incident on the light incident surface of the optical guide. As a result, the light can be utilized at high efficiency.

According to an exemplary embodiment the light exiting surface of the solid-state light-emitting chip has a rectangular shape having a first side and a second side substantially equal to or shorter than the first side, and that the predetermined spacing is smaller than the length of the second side. This enables reduction in the spacing between the solid-state light-emitting chip and the optical guide. Therefore, the light from the solid-state light-emitting chip efficiently becomes incident on the light incident surface of the optical guide. Thus, the light can be utilized at high efficiency.

According to a second aspect of the exemplary embodiments, a method for manufacturing a light source includes a solid-state light-emitting chip to support a solid-state light-emitting chip with a solid-state light-emitting support part, the solid-state light-emitting chip supplying light of a predetermined wavelength range, supporting an optical guide with an optical guide supporting part, the optical guide reflecting the light of the predetermined wavelength range and thus causing the light to exit into an illuminating direction. Thus, a light source having a small size and high efficiency and allowing a high degree of freedom in design as described above can be provided by a simple process. Moreover, according to an exemplary embodiment, the method for manufacturing the light source includes filling space between a light exiting surface of the solid-state light-emitting chip and a light incident surface of the optical guide with an optically transparent material. This enables provision of a light source having higher efficiency.

According to an exemplary embodiment, the method for manufacturing the light source includes causing the position of the solid-state light-emitting chip and the position of the optical guide to substantially coincide with each other. This enables easy alignment of the solid-state light-emitting chip and the optical guide.

According to a third aspect of the exemplary embodiments, a projector has the above light source, a spatial light modulator that modulates light from the light source in accordance with an image signal, and a projection lens that projects the modulated light. Since this projector has the above light source, it can be small-sized and can provide a bright projection image.

BRIEF DESCRIPTION OF THE DRAWINGS

FIG. 4-1 is a schematic showing a first modification of an optical guide in an exemplary embodiment;

FIG. 4-2 is a schematic showing a second modification of an optical guide in an exemplary embodiment;

FIG. 4-3 is a schematic showing still another modification of an optical guide in an exemplary embodiment;

FIG. 4-4 is a schematic showing another modification of an optical guide in an exemplary embodiment.

DETAILED DESCRIPTION OF EMBODIMENTS

Hereinafter, exemplary embodiments of the light source and the projector having this light source will be described in detail with reference to the drawings. However, this invention is not limited by these exemplary embodiments.

Exemplary Embodiment 1

Figure 1:
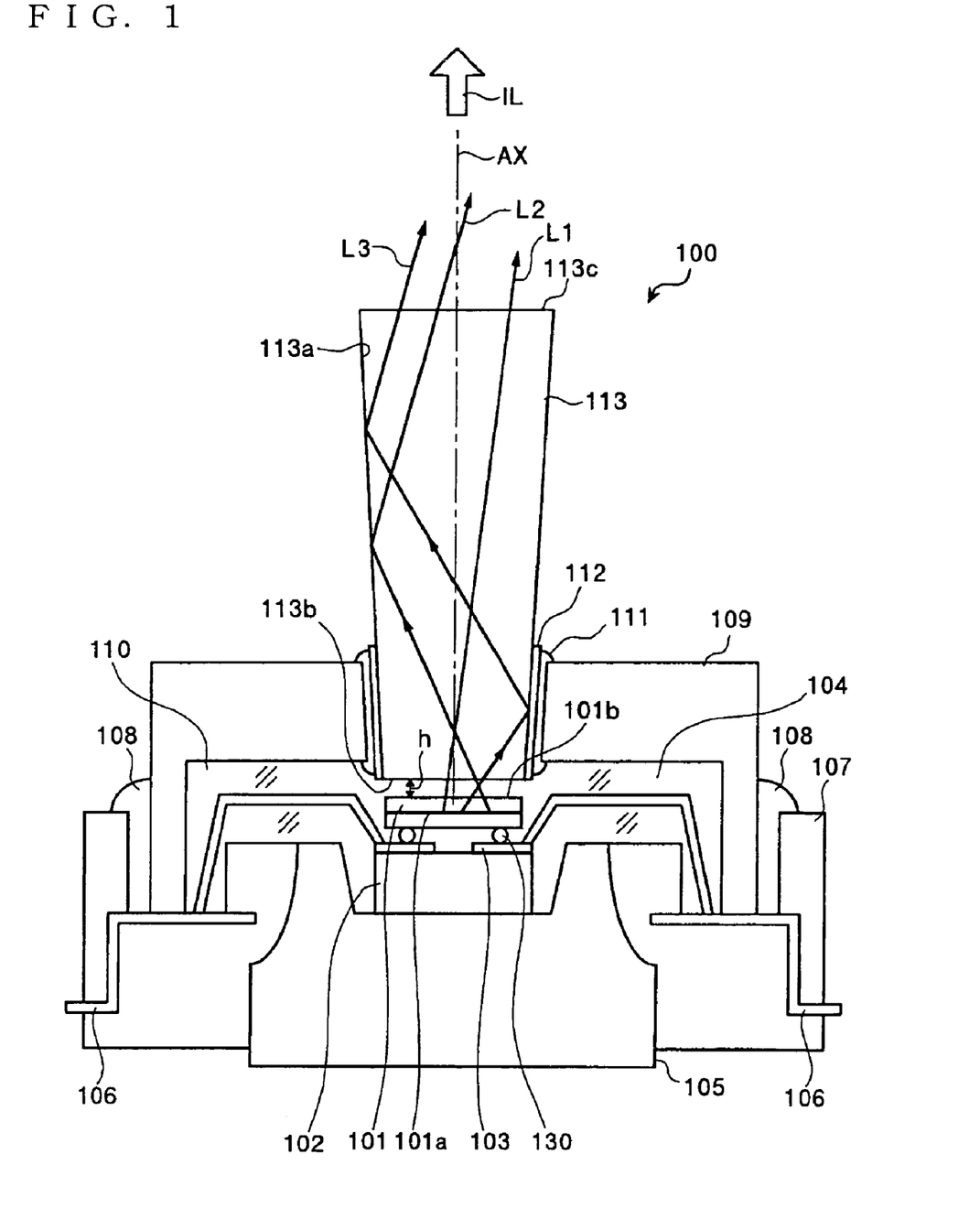
FIG. 1 is a schematic showing a structure of a light source according to an exemplary embodiment.

FIG. 1 shows a schematic structure of a light source 100 according to Exemplary Embodiment 1. A solid-state light-emitting chip 101 is an InGaN-based LED flip chip that supplies light of a predetermined wavelength range, for example, green light (hereinafter referred to as "G-light"). On a silicon base 102, electric wirings such as electrodes 103 are patterned. The solid-state light-emitting chip 101 is fixed on the silicon base 102 by silver paste or solder 130. The silicon base 102 is fixed on a heat sink 105 made of copper or iron. The heat sink 105 may radiate heat generated in the solid-state light-emitting chip 101. Moreover, the heat sink 105, together with electrode lead parts 106, is fixed to a package mold 107 made of plastics, by insertion-molding. The electrodes 103 on the silicon base 102 and the electrode lead parts 106 are electrically connected with each other by wire bonding 104. As a predetermined voltage is applied to the two electrode lead parts 106, the solid-state light-emitting chip 101 can be driven.

An optical guide 113 repeatedly reflects the G-light from the solid-state light-emitting chip 101 and thus causes the G-light to exit into an illuminating direction IL. The optical guide 113 is made of glass, transparent plastic(s) or the like. A light incident surface 113b of the optical guide 113 is larger than a light exiting surface 101b of the solid-state light-emitting chip 101. Moreover, the optical guide 113 has a tapered shape having a light exiting surface 113c larger than the light incident surface 113b.

The optical guide 113 is fixed to a support 109, which is an optical guide supporting part, via an adhesive part 111. The support 109 is made of plastics, metal, ceramics or the like. The support 109 is fixed to the package mold 107 via an adhesive part 108. The silicon base 102, the heat sink 105 and the package mold 107 constitute a solid-state light-emitting chip supporting part. The solid-state light-emitting chip supporting part supports the solid-state light-emitting chip 101. The light exiting surface 101b of the solid-state light-emitting chip 101 and the light incident surface 113b of the optical guide 113 are provided at a predetermined spacing h.

Thus, a light L1 from the solid-state light-emitting chip 101 travels through the optical guide 113 and exits from the light exiting surface 113c into the illuminating direction IL. Lights L2 and L3, from the solid-state light-emitting chip 101, are repeatedly reflected within the optical guide 113 and exit from the light exiting surface 113c into the illuminating direction IL. Since the lights L1, L2 and L3 are superimposed, light having high efficiency and uniform intensity distribution can be provided. Moreover, since a large optical integration system is not needed, the light source 100 of a small size can be realized. Furthermore, the light exiting surface 101b of the solid-state light-emitting chip 101 and the light incident surface 113b of the optical guide 113 are provided at the predetermined space h. Therefore, propagation of heat generated in the solid-state light-emitting chip 101 to the optical guide 113 can be reduced or minimized.

In addition, the optical guide 113 also has a function of relaying an image of the solid-state light-emitting chip 101. Therefore, a desired optical device, for example, a lens element, prism element or the like, can be easily provided at the position to which the image of the solid-state light-emitting chip 101 is relayed. Thus, the light source 100 having a high degree of freedom in design can be provided without changing the structure of the solid-state light-emitting chip 101 itself.

The space of the predetermined spacing h may be filled with a transparent silicon gel 110, which is an optically transparent soft material, as well as a gas. It is desirable that the transparent silicon gel 110 has substantially the same refractive index as the refractive index of the glass forming the optical guide 113. In this exemplary embodiment, the refractive index of the transparent silicon gel 110 is approximately 1.5. In the case where the spacing between the solid-state light-emitting chip 101 and the optical guide 113 is filled with a gas, the light form the solid-state light-emitting chip 101 is totally reflected by, for example, the interface to the air, and this lowers the light utilization efficiency. In this exemplary embodiment, index matching is achieved by the transparent silicon gel 110. More preferably, it is desirable that the refractive index of the transparent silicon gel 110 is also matched with the refractive index of the material forming the light exiting surface 101b of the solid-state light-emitting chip 101. Thus, since the G-light from the solid-state light-emitting chip 101 is not totally or substantially reflected by the interface of the light incident surface 113b of the optical guide 113 or the like, the light can be utilized at high efficiency.

The optical guide 113 also has a reflection film 112 formed at least at a part in contact with the support 109 forming a part of the optical guide supporting part. The reflection film 112 is an aluminum film that reflects the G-light. The G-light supplied from the solid-state light-emitting chip 101 becomes incident on the optical guide 113 at various angles. For example, the light L3 incident on the optical guide 113 is reflected by the reflection film 112. Moreover, the optical guide 113 totally reflects the light L3 on its total reflection surface 113a, which is an interface to external air. Therefore, the light L3 reflected by the reflection film 112 further repeats being totally reflected and then exits from the optical guide 113 at the light exiting surface 113c. As a result, the light from the solid-state light-emitting chip 101 can be utilized at high efficiency.

The light exiting surface 101b of the solid-state light-emitting chip 101 has a rectangular shape having a first side and a second side substantially equal to or shorter than the first side. The predetermined spacing h is set to be shorter than the length of the second side. For example, the solid-state light-emitting chip 101 may have a square shape with both of its first and second sides being about 1 mm. The predetermined spacing h may be 0.2 mm. This enables reduction in the spacing h between the solid-state light-emitting chip 101 and the optical guide 113. Therefore, the G-light from the solid-state light-emitting chip 101 can efficiently become incident on the light incident surface 113b of the optical guide 113. Thus, the light can be utilized at high efficiency.

Moreover, the light incident surface 113b of the optical guide 113 has an area substantially equal to or larger than the light exiting surface 101b of the solid-state light-emitting chip 101. For example, the light incident surface 113b of the optical guide 113 may have a size of approximately 1.2 mm by 1.2 mm. This enables the optical guide 113 to efficiently take in the light from the solid-state light-emitting chip 101. The optical guide 113 may have a tapered shape having the light exiting surface 113c larger than the light incident surface 113b. For example, the light incident surface 113b may be set to a size of approximately 1.2 mm by 1.2 mm as described above, and the light exiting surface 113c may be set to a size of approximately 4 mm by 3 mm. The tapered shape enables uniform intensity distribution and parallelization of the exiting lights L1, L2 and L3 at the same time.

Next, the procedures for manufacturing the light source 100 will be described. First, the solid-state light-emitting chip 101 that supplies G-light, which is light of a predetermined wavelength range, is supported by the solid-state light-emitting chip supporting part. As described above, the solid-state light-emitting device supporting part is formed by the silicon base 102, the heat sink 105 and the package mold 107. The optical guide 113 that reflects the G-light and causes the G-light to exit into the illuminating direction IL is supported by the support 109. When necessary, the space between the light exiting surface 101b of the solid-state light-emitting chip 101 and the light incident surface 113b of the optical guide 113 is filled with a transparent silicon gel, which may be an optically transparent resin. Moreover, when necessary, the position of the light exiting surface 101b of the solid-state light-emitting chip 101 and the position of the light incident surface 113b of the optical guide 113 may be made substantially coincident with each other. The section where the adhesive part 108 is provided functions as an adjustment spacing for alignment of the package mold 107 and the support 109. In the state where an adhesive is not fed to the adhesive part 108, the support 109 can move horizontally relative to the package mold 107 within the range of the adjustment spacing (see FIG. 1). When, for example, the support 109 has moved to complete the alignment, the support 109 may be fixed by using an adhesive. This enables easy alignment of the solid-state light-emitting chip 101 and the optical guide 113. Finally, the support 109 and the package mold 107 may be fixed as their positions have been adjusted. As a result, the light source 100 having a small size, high efficiency and a high degree of freedom in design as described above can be provided.

Exemplary Embodiment 2

Figure 2:
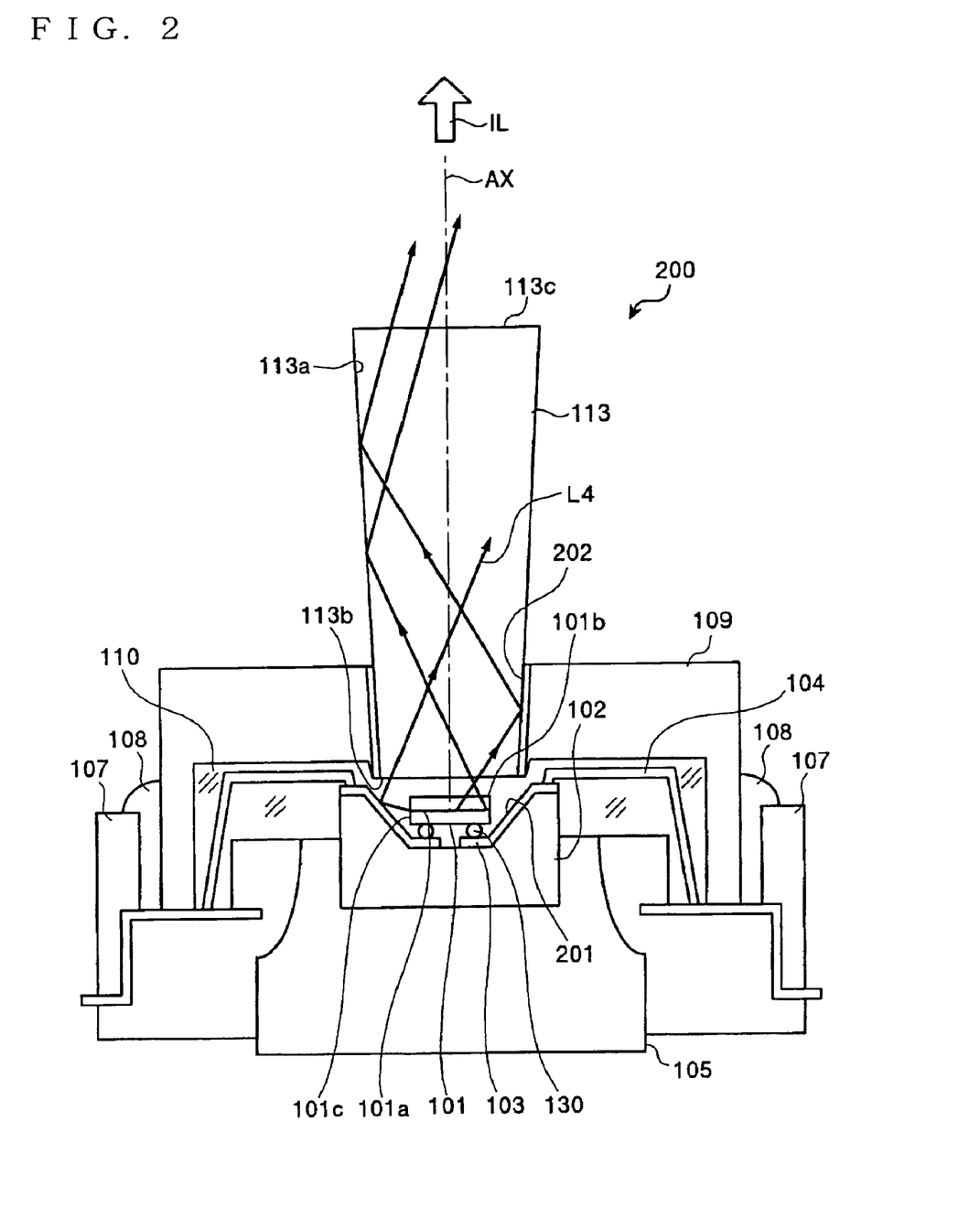
FIG. 2 is a schematic showing a structure of a light source according to an exemplary embodiment.

FIG. 2 shows a schematic structure of a light source 200 according to Exemplary Embodiment 2. The same parts as those in the above-described Exemplary Embodiment 1 are denoted by the same numerals and duplicate explanation of these parts will not be made. An optical axis AX of the solid-state light-emitting chip 101 extends in a normal direction of a flat active layer 101a, which is a light-emitting region. The solid-state light-emitting chip 101 has the lateral surface 101c in a direction substantially orthogonal to the direction of the optical axis AX. The silicon base 102 constituting a part of a solid-state light-emitting chip supporting part has a tilt mirror 201, which is a reflection part, formed on a surface facing the lateral surface 101c of the solid-state light-emitting chip 101. The solid-state light-emitting chip 101 radiates light into every direction from the active layer 101a arranged between two semiconductor layers. Therefore, G-light radiated into a direction different from the direction of the light incident surface 113b of the optical guide 113 cannot be utilized effectively. Particularly G-light exiting into the direction of the lateral surface 101c of the solid-state light-emitting chip 101 results in light quantity loss. In this exemplary embodiment, the tilt mirror 201 can reflect a light L4 traveling into the direction of the lateral surface 101c to the direction of the optical guide 113. This enables improvement in the utilization efficiency of the light L4.

The light incident surface 113b of the optical guide 113 has an area substantially equal to or larger than a region including the light exiting surface 101b of the solid-state light-emitting chip 101 and the tilt mirror 201. In this exemplary embodiment, the light incident surface 113b of the optical guide 113 may be set to a size of about 1.4 mm by 1.4 mm. This enables the light from the solid-state light-emitting chip 101 to efficiently become incident on the light incident surface 113b of the optical guide 113. As a result, the G-light can be utilized at high efficiency.

Moreover, the support 109, which is an optical guide supporting part, has a metal reflection surface 202 formed by plating on the inner surface of a region in contact with the optical guide 113. The support 109 and the optical guide 113 are fixed to each other by an optically transparent adhesive. Thus, the light incident on the optical guide 113 is reflected by the metal reflection surface 202 of the support 109. Furthermore, the optical guide 113 may repeatedly totally or substantially reflect the light reflected by the metal reflection surface 202, on the total reflection surface 113a, which is the interface to external air. The light that travels while repeating being totally or substantially reflected exits from the optical guide 113 at the light exiting surface 113c into the illuminating direction IL. As a result, the light from the solid-state light-emitting chip 101 can be uniform in intensity distribution and parallelized, while it can be utilized at high efficiency.

Exemplary Embodiment 3

Figure 3:
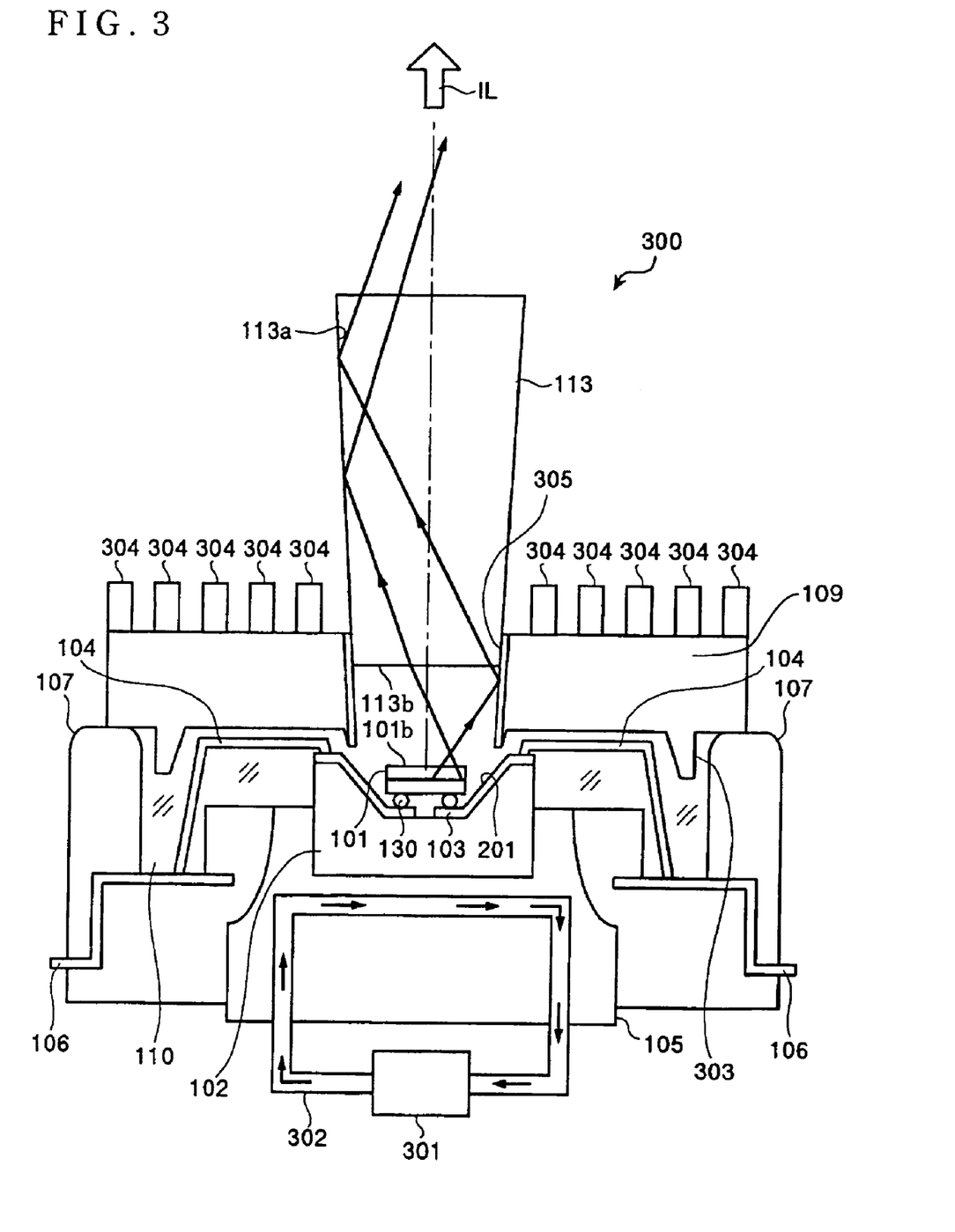
FIG. 3 is a schematic showing a structure of a light source according to an exemplary embodiment.

FIG. 3 shows a schematic structure of a light source 300 according to Exemplary Embodiment 3. The same parts as those in the above-described Exemplary Embodiment 1 are denoted by the same numerals and duplicate explanation of these parts will not be made. In this exemplary embodiment, a mirror-finished metal mirror 305 is formed on a surface of the support 109 made of aluminum that supports the optical guide 113. The support 109 and the optical guide 113 are fixed to each other by an optically transparent adhesive, as described above. Also, plural fins 304 for heat radiation are formed on a surface of the support 109 facing the illuminating direction IL. Moreover, protruding position adjustment parts 303 are provided on a surface of the support 109 opposite to the illuminating direction IL. As described in Exemplary Embodiment 1, the position of the light exiting surface 101b of the solid-state light-emitting chip 101 and the position of the light incident surface 113b of the optical guide 113 may be substantially coincident with each other. In this embodiment, the position adjustment parts 303 for alignment in the horizontal direction in FIG. 3 are provided. Position adjustment can be made within the range of clearance between the protruding position adjustment parts 303 and the package mold 107. Therefore, alignment of the package mold 107 and the support 109 can be performed more easily and accurately.

In this exemplary embodiment, a circulation part 302 for circulating a coolant in the heat sink 105 is formed. A pump 301, which is a fluid feeding part, circulates a coolant, for example, water, through the circulation part 302. The coolant may be either liquid or gas. This enables more efficient cooling of the solid-state light-emitting chip 101.

Referring to FIGS. 4-1 to 4-4, exemplary modifications of the structure of the optical guide will be described. FIG. 4-1 shows a schematic structure of a first modification of an optical guide 400. The optical guide 400 may have a straight cylindrical shape having a light incident surface 413b and a light emitting surface 413c that are substantially equal to each other. In the case where the optical guide 400 has a straight cylindrical shape, the intensity distribution of exiting light can be uniform with a decreased light-emitting area. The optical guide 400 has a reflection film 401 formed in an entire region along the traveling direction of light. Light that becomes incident on the interface of the optical guide 400 to air at an angle that does not satisfy a total reflection condition is caused to directly exit into a substantially lateral direction of the optical guide 400. This results in light quantity loss. In this modification, the reflection film 401 is formed in the entire region of the lateral surface of the optical guide 400 along the traveling direction of light. Therefore, all the light that becomes incident on the lateral surface at various angles can be totally or substantially reflected to exit into the illuminating direction IL.

Figure 42:
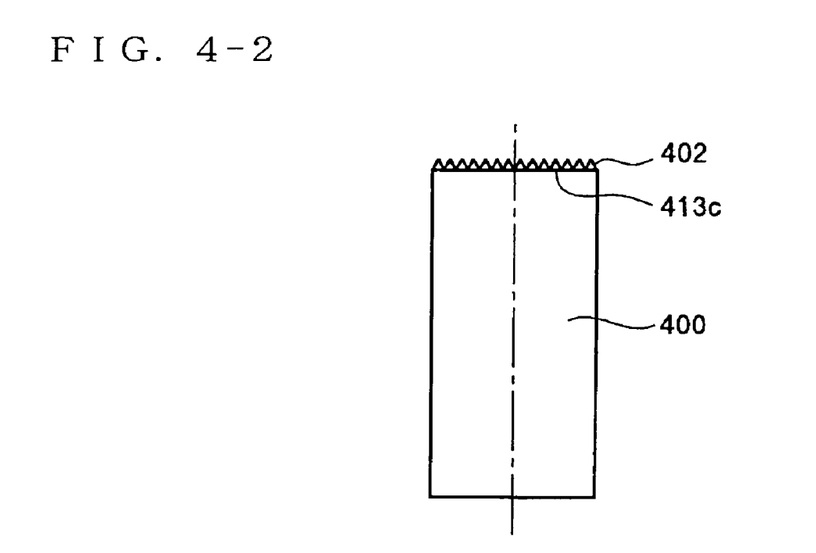
Figure 43:
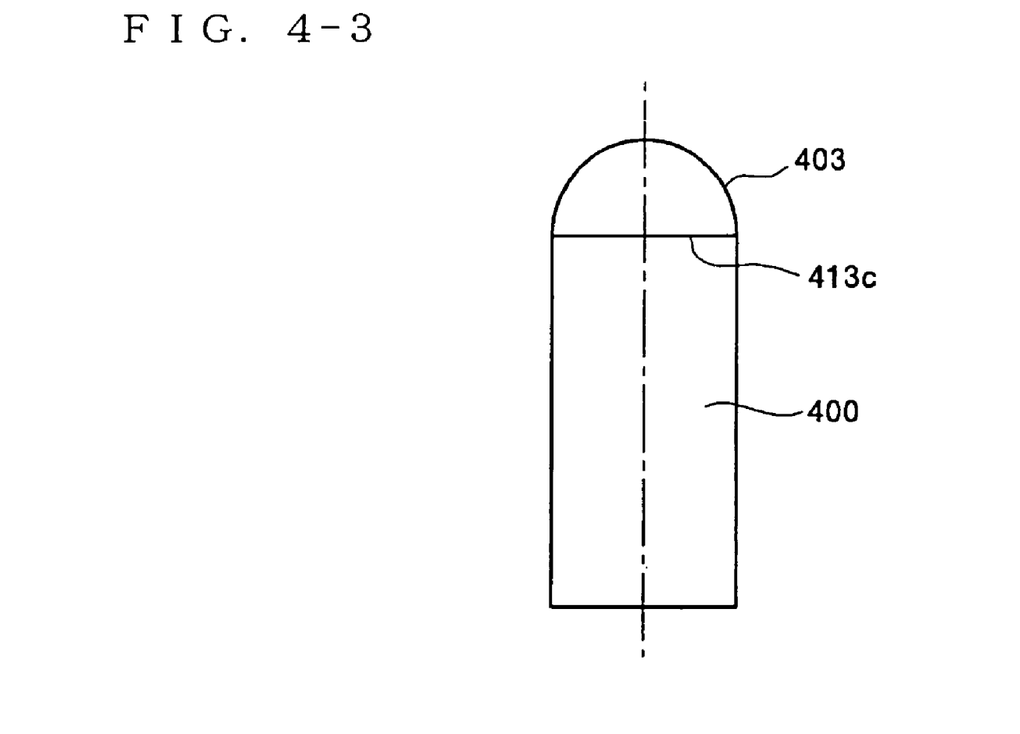
Figure 44:
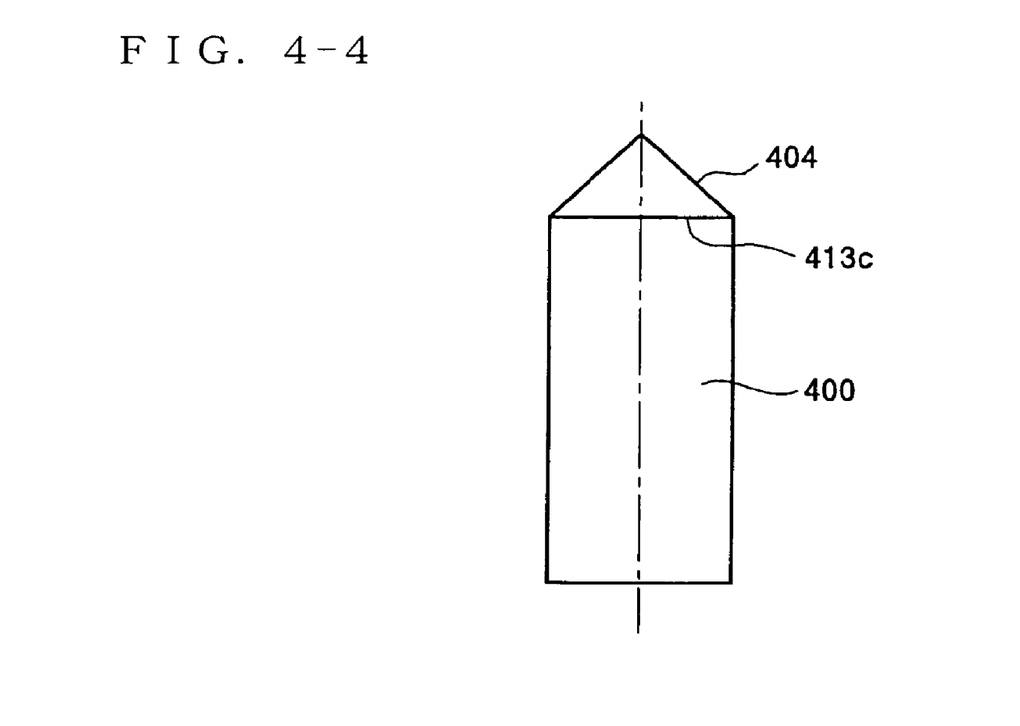

FIG. 4-2 shows a second modification of the optical guide 400. A diffusion surface 402 is formed on the light exiting surface 413c. This enables further uniformity of the intensity of exiting light. Also, a lens element 403 can be fixed to the light exiting surface 413c, as shown in FIG. 4-3. Moreover, a prism element 404 can be fixed to the light exiting surface 413c, as shown in FIG. 4-4. With these structures, deflection, condensation or the like of the exiting light can be carried out by the lens element 403 or the prism element 404 without changing the structure of the solid-state light-emitting chip 101. Therefore, the degree of freedom in optical design increases without lowering the reliability of the solid-state light-emitting chip 101.

Exemplary Embodiment 4

Figure 5:
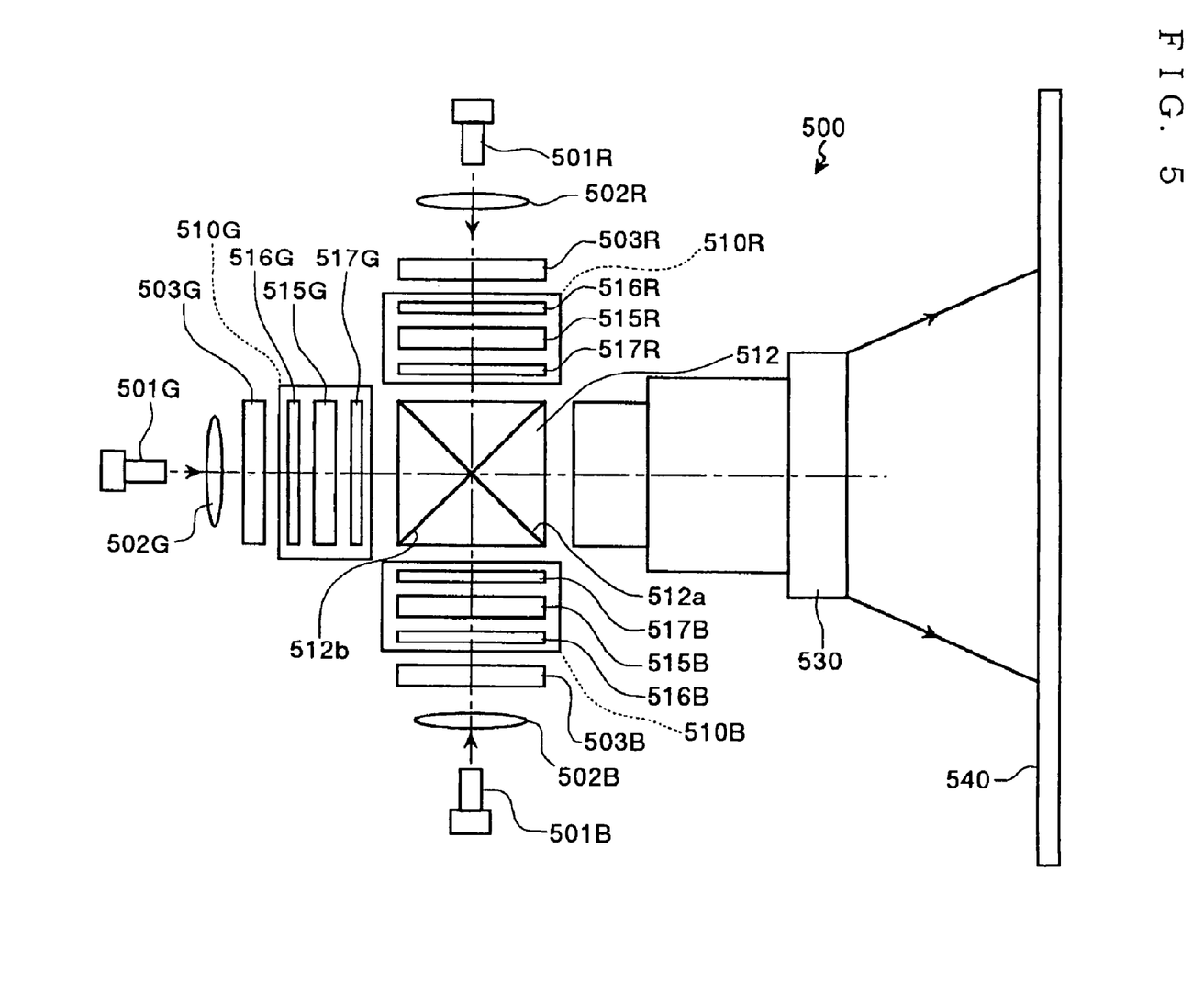
FIG. 5 is a schematic showing a schematic structure of a projector according to an exemplary embodiment.
Figure 41:
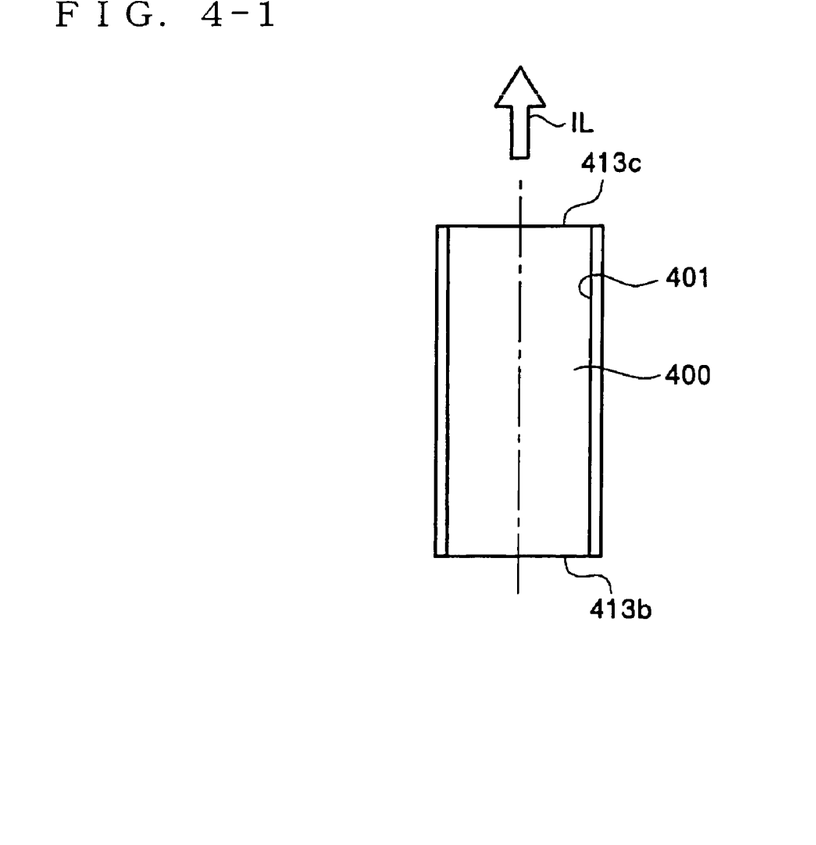

FIG. 5 shows a schematic structure of a projector 500 according to Exemplary Embodiment 4. The projector 500 has a first light source part 501R that supplies red light (hereinafter referred to as "R-light"), which is a first color light, a second light source part 501G that supplies G-light, which is a second color light, and a third light source part 501B that supplies blue light (hereinafter referred to as "B-light"), which is a third color light. Each of the first light source part 501R, the second light source part 501G and the third light source part 501B is an LED device using the light source 100 described above with respect to Exemplary Embodiment 1.

The R-light from the first light source part 501R becomes incident on a polarization conversion element 503R via a condensing lens 502R. The polarization conversion element 503R converts the R-light into polarized light having a specific oscillating direction, for example, p-polarized light. The polarization-converted R-light becomes incident on an R-light spatial light modulator 510R, which is a first color light spatial light modulator. The R-light spatial light modulator 510R is a transmissive liquid crystal display device that modulates the R-light in accordance with an image signal. The R-light spatial light modulator 510R has a liquid crystal panel 515R, a first polarizer 516R and a second polarizer 517R.

The first polarizer 516R transmits the R-light, which has been converted to p-polarized light, and makes the R-light incident on the liquid crystal panel 515R. The liquid crystal panel 515R modulates the p-polarized light in accordance with an image signal and converts it to s-polarized light. The second polarizer 517R causes the R-light to exit, which has been converted to s-polarized light by the liquid crystal panel 515R. In this manner, the R-light spatial light modulator 510R modulates the R-light from the first light source part 501R. The R-light converted to s-polarized light by the R-light spatial light modulator 510R becomes incident on a cross dichroic prism 512.

The G-light from the second light source part 50G becomes incident on a polarization conversion element 503G via a condensing lens 502G. The polarization conversion element 503G converts the G-light into polarized light having a specific oscillating direction, for example, s-polarized light. The polarization-converted G-light becomes incident on a G-light spatial light modulator 510G, which is a second color light spatial light modulator. The G-light spatial light modulator 510G is a transmissive liquid crystal display device that modulates the G-light in accordance with an image signal. The G-light spatial light modulator 510G has a liquid crystal panel 515G, a first polarizer 516G and a second polarizer 517G.

The first polarizer 516G transmits the G-light, which has been converted to s-polarized light, and makes the G-light incident on the liquid crystal panel 515G. The liquid crystal panel 515G modulates the s-polarized light in accordance with an image signal and converts it to p-polarized light. The second polarizer 517G causes the G-light to exit, which has been converted to p-polarized light by the liquid crystal panel 515G. In this manner, the G-light spatial light modulator 510G modulates the G-light from the second light source part 501G. The G-light converted to p-polarized light by the G-light spatial light modulator 510G becomes incident on the cross dichroic prism 512.

The B-light from the third light source part 501B becomes incident on a polarization conversion element 503B via a condensing lens 502B. The polarization conversion element 503B converts the B-light into polarized light having a specific oscillating direction, for example, p-polarized light. The polarization-converted B-light becomes incident on a B-light spatial light modulator 510B, which is a third color light spatial light modulator. The B-light spatial light modulator 510B is a transmissive liquid crystal display device that modulates the B-light in accordance with an image signal. The B-light spatial light modulator 510B has a liquid crystal panel 515B, a first polarizer 516B and a second polarizer 517B.

The first polarizer 516B transmits the B-light, which has been converted to p-polarized light, and makes the B-light incident on the liquid crystal panel 515B. The liquid crystal panel 515B modulates the p-polarized light in accordance with an image signal and converts it to s-polarized light. The second polarizer 517B causes the B-light to exit, which has been converted to s-polarized light by the liquid crystal panel 515B. In this manner, the B-light spatial light modulator 510B modulates the B-light from the third light source part 501B. The B-light converted to s-polarized light by the B-light spatial light modulator 510B becomes incident on the cross dichroic prism 512.

The cross dichroic prism 512 has two dichroic filters 512a and 512b. The two dichroic filters 512a and 512b are arranged orthogonally to each other in an X-shape. The dichroic filter 512a reflects the R-light, which is s-polarized light, and transmits the G-light, which is p-polarized light. The dichroic filter 512b reflects the B-light, which is s-polarized light, and transmits the G-light, which is p-polarized light. In this manner, the cross dichroic prism 512 combines the R-light, G-light and B-light modulated by the first color light spatial light modulator 510R, the second color light spatial light modulator 510G and the third color light spatial light modulator 510B, respectively. A projection lens 530 projects the light combined by the cross dichroic prism 512 onto a screen 540. Since the projector 500 has the above-described light source, it can be small-sized and can provide a bright projection image.

While the above-described exemplary embodiments are described by using LED as an example, the exemplary embodiments are not limited to LED. The exemplary embodiments can also be applied to other solid-state light-emitting devices, for example, an electroluminescence (EL) device or the like.

EXEMPLARY INDUSTRIAL APPLICABILITY

As described above, the light source according to the exemplary embodiments is particularly useful for LED and is suitable for a projector.

What is claimed is:

1. A light source, comprising:
a solid-state light-emitting chip that supplies light of a predetermined wavelength range, the solid-state light-emitting chip defining a light-emitting surface;
a solid-state light-emitting chip supporting part that supports the solid-state light-emitting chip;
an optical guide that reflects the light from the solid-state light-emitting chip to cause the light to exit in an illuminating direction, the optical guide defining a light incident surface, the light incident surface and the light-emitting surface of the solid-state light-emitting chip being provided at a predetermined spacing, the light-emitting surface of the solid-state light-emitting chip having a rectangular shape having a first side and having a second side substantially equal to or shorter than the first side, the predetermined spacing being smaller than the length of the second side, wherein the illuminating direction of the light exiting from a light-exiting surface of the optical guide is substantially perpendicular to the light-emitting surface of the solid-state light-emitting chip; and
an optical guide supporting part that supports the optical guide.

2. The light source as claimed in claim 1, further comprising an optically transparent soft material filling a space of the predetermined spacing,
the optically transparent soft material having a refractive index that is substantially the same as a refractive index of a member constituting the optical guide.

3. The light source as claimed in claim 2, the optically transparent soft material having a refractive index greater than 1.003 but less than 1.4.

4. The light source as claimed in claim 2, the optically transparent soft material having a refractive index greater than 1.4.

5. The light source as claimed in claim 2, the optically transparent soft material having a refractive index approximately equal to 1.5.

6. The light source as claimed in claim 1, the optical guide having a reflection film that reflects the light of the predetermined wavelength range at least at a part in contact with the optical guide supporting part.

7. The light source as claimed in claim 6, the optical guide having the reflection film formed in an entire region of a surface along a traveling direction of the light.

8. The light source as claimed in claim 6, wherein the reflection film is an aluminum film.

9. The light source as claimed in claim 1, the optical guide supporting part having a reflection surface formed in a region in contact with the optical guide.

10. The light source as claimed in claim 1, the solid-state light-emitting chip supporting part having a heat sink for reducing heat generated in the solid-state light-emitting chip and an electrode for driving the solid-state light-emitting chip.

11. The light source as claimed in claim 1, the optical guide having at least one of a tapered shape with a light exiting surface being larger than a light incident surface, and a cylindrical shape having substantially equal light incident surface and light exiting surface, the light incident surface of the optical guide being substantially equal to or larger than a light-emitting surface of the solid-state light-emitting chip.

12. The light source as claimed in claim 1, the solid-state light-emitting chip having a lateral surface in a direction substantially orthogonal to a normal direction in a light-emitting region, and
the solid-state light-emitting chip supporting part having a reflection part formed on a surface facing the lateral surface.

13. The light source as claimed in claim 12, the light incident surface of the optical guide being substantially equal to or larger than a region including the light-emitting surface of the solid-state light-emitting chip and the reflection part.

14. A projector, comprising:
the light source as claimed in claim 1;
a spatial light modulator that modulates light from the light source based on an image signal; and
a projection lens that projects the modulated light.

15. The light source as claimed in claim 1, wherein the light-exiting surface of the optical guide is fitted with at least one of a diffusion surface, a lens element, and a prism element.

16. A method for manufacturing a light source comprising:
supporting a solid-state light-emitting chip with a solid-state light-emitting supporting part, the solid-state light-emitting chip supplying light of a predetermined wavelength range, the solid-state light-emitting chip defining a light-emitting surface having a rectangular shape with a first side and a second side substantially equal to or shorter than the first side,
supporting an optical guide with an optical guide supporting part, the optical guide reflecting the light from the light-emitting surface of the solid-state light-emitting chip and thus causing the light to exit into an illuminating direction at a predetermined spacing smaller than the second side, wherein the illuminating direction of the light exiting from a light-exiting surface of the optical guide is substantially perpendicular to the light-emitting surface of the solid-state light-emitting chip; and
fixing the solid-state light-emitting chip supporting part and the optical guide supporting part.

17. The method for manufacturing a light source as claimed in claim 16, further including:
causing a position of the solid-state light-emitting chip and a position of the optical guide to substantially coincide with each other.

18. The method for manufacturing a light source as claimed in claim 16, further including:
filling a space between a light-emitting surface of the solid-state light-emitting chip and a light incident surface of the optical guide with an optically transparent material.

* * * * *